(12) United States Patent
Gupta et al.

(10) Patent No.: US 11,184,688 B2
(45) Date of Patent: Nov. 23, 2021

(54) MINIMAL TOUCH POST FOR MULTI-LAYER CABLE ROUTING

(71) Applicant: Cisco Technology, Inc., San Jose, CA (US)

(72) Inventors: Rohit Dev Gupta, Bangalore (IN); Joel Goergen, Soulsbyville, CA (US); Arjun Guzar Jayaprakash, Bengaluru (IN); Naveen Kumar Bangalore Shiva Kumar, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/672,942

(22) Filed: Nov. 4, 2019

(65) Prior Publication Data

US 2021/0136468 A1 May 6, 2021

(51) Int. Cl.
*H04Q 1/06* (2006.01)
*H04Q 1/04* (2006.01)
(Continued)

(52) U.S. Cl.
CPC ............ *H04Q 1/064* (2013.01); *H04Q 1/04* (2013.01); *H05K 7/183* (2013.01); *H05K 7/186* (2013.01); *H04L 49/40* (2013.01)

(58) Field of Classification Search
CPC .......... H04Q 1/064; H04Q 1/04; H05K 7/183; H05K 7/186; H05K 7/1491; H05K 7/1489;
(Continued)

(56) References Cited

U.S. PATENT DOCUMENTS 5,921,402 A * 7/1999 Magenheimer .......... H02G 3/26
  211/26
6,170,784 B1 * 1/2001 MacDonald ......... H05K 7/1448
  211/26
(Continued)

OTHER PUBLICATIONS

Oracle, "Oracle ZFS Storage Appliance Installation Guide", 2 pages, downloaded from Internet Sep. 20, 2019; https://docs.oracle.eom/cd/E56021/01/html/E55847/govrz.html#.
(Continued)

*Primary Examiner* — Stephen S Sul
*Assistant Examiner* — Michael A Matey
(74) *Attorney, Agent, or Firm* — Edell, Shapiro & Finnan, LLC

(57) ABSTRACT

A system includes a tray, where the tray includes a rail and a bracket that secures the rail to a networking device such that the rail is distanced from a surface of the networking device. A support post is removably coupled to the rail. The support post includes a first support member and a second support member vertically displaced from the first support member, where each of the first and second support members includes a support structure that supports a cable connected with a port at the surface of the networking device and routes the cable away from the networking device to another location distanced from the networking device. The cable supported by the first support member is separated and segregated from the cable supported by the second support member. With minimal touch, a support post can be moved from one location to another along the rail.

19 Claims, 11 Drawing Sheets

(51) Int. Cl.
*H05K 7/18* (2006.01)
*H04L 12/931* (2013.01)

(58) Field of Classification Search
CPC ........ H05K 5/0204; H05K 7/14; H04L 49/40; H02B 1/202
See application file for complete search history.

(56) References Cited

U.S. PATENT DOCUMENTS

| | | | | |
|---|---|---|---|---|
| 7,022,916 | B1* | 4/2006 | Cavanaugh | H05K 7/1491 174/100 |
| 7,734,139 | B2* | 6/2010 | Rector, III | G02B 6/4471 385/136 |
| 7,848,102 | B2* | 12/2010 | Fan | G06F 1/181 361/679.58 |
| 8,770,532 | B2 | 7/2014 | Ruiz et al. | |
| 8,953,924 | B2 | 2/2015 | Cote et al. | |
| 9,020,320 | B2* | 4/2015 | Cooke | G02B 6/4452 385/135 |
| 9,212,765 | B1* | 12/2015 | Chia | H04Q 1/06 |
| 9,548,598 | B2* | 1/2017 | Tally | H02G 3/32 |
| 9,556,972 | B2* | 1/2017 | White | F16L 3/02 |
| 10,076,054 | B2 | 9/2018 | Goergen et al. | |
| 10,117,348 | B2 | 10/2018 | Babcock et al. | |
| 10,416,406 | B1* | 9/2019 | Ebrahimi | G02B 6/4452 |
| 10,638,636 | B1* | 4/2020 | Chen | H01R 9/2416 |
| 2004/0113024 | A1* | 6/2004 | Caveney | H02G 3/0456 248/49 |
| 2006/0113433 | A1* | 6/2006 | Chen | H05K 7/1491 248/70 |
| 2006/0171075 | A1* | 8/2006 | Caveney | H04Q 1/142 360/234.3 |
| 2007/0104450 | A1* | 5/2007 | Phung | G02B 6/4459 385/137 |
| 2008/0093510 | A1* | 4/2008 | Oh | F16B 3/2235 248/63 |
| 2008/0099635 | A1* | 5/2008 | Laursen | H02G 3/30 248/68.1 |
| 2009/0078834 | A1* | 3/2009 | Chen | H05K 7/1491 248/70 |
| 2010/0209068 | A1* | 8/2010 | Womack | G02B 6/4471 385/137 |
| 2015/0271945 | A1* | 9/2015 | Chen | H05K 7/1489 248/70 |
| 2016/0062050 | A1* | 3/2016 | Giraud | G02B 6/3879 385/56 |
| 2018/0035563 | A1* | 2/2018 | Chen | H05K 7/1491 |
| 2018/0167700 | A1* | 6/2018 | Sticker | H04Q 1/066 |
| 2018/0252335 | A1* | 9/2018 | Goergen | H04Q 1/09 |
| 2019/0234533 | A1 | 8/2019 | Brouwer et al. | |

OTHER PUBLICATIONS

Allied Electronics Automation, Panduit ER1.25-E4-X, 2 pages, downloaded from Internet Nov. 4, 2019, https://www.alliedelec.com/product/panduit/er1-25-e4-x/70044439/?gclid=Cj0KCQjw4-XIBRDuARIsAK96p3DLs6GM_PVzezqK5ZEfViYpu-oxkDDs3ETBhNwX3O7yoMuYCyvMoJQaAmO3EALw_wcB&gclsrc=aw.ds.

* cited by examiner

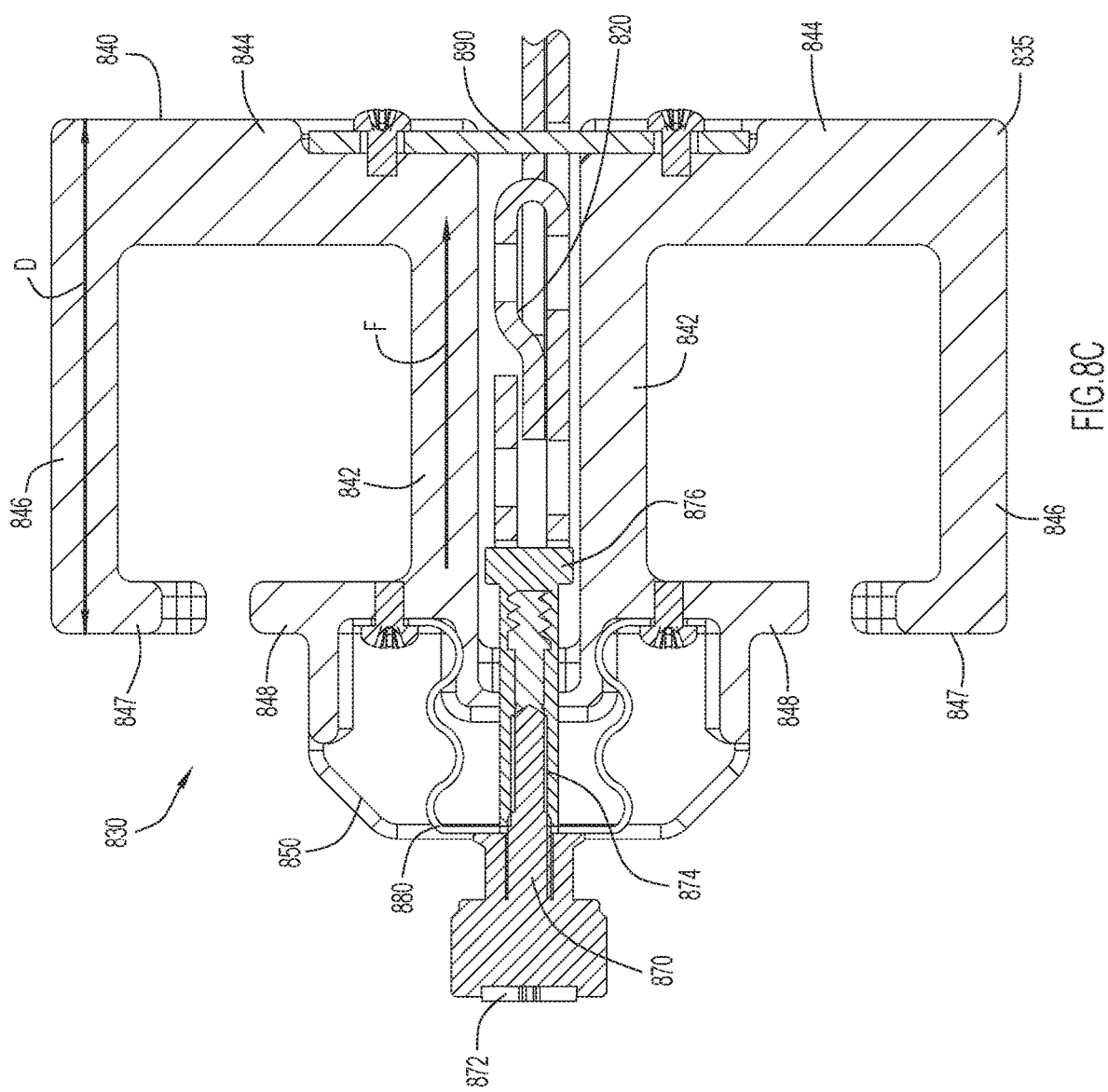

MINIMAL TOUCH POST FOR MULTI-LAYER CABLE ROUTING

TECHNICAL FIELD

The present disclosure relates to networking equipment with multiple cable ports and accessory equipment to support network cables connected with the cable ports.

BACKGROUND

With ever increasing demands associated with processing larger amounts of data for business and other applications, networking devices (e.g., hubs, switches, routers, gateways etc.) have become more sophisticated with increasing port densities to facilitate greater numbers of cables (fiber optic and/or copper) to connect such devices with other networking equipment in order to efficiently transmit data to and from desired destinations. However, the large numbers of cables emerging from a network device can be difficult to physically support while maintaining a secure connection between the cable ports of the device and another physical connection. Certain known solutions bundle together cables that are connected with device ports so as to maintain an ordered flow or routing of the cables along or proximate a port side (e.g., front side) of the device. However, when bundling the cables together, they can become heavy such that more than one physical support may be required (e.g., a number of supports provided at, e.g., about every 1.5 to 2.0 inches in distance) in order to maintain a minimal bend radius for the cables. Further, physical structure (e.g., clips, brackets and/or other types of suspension structure) provided to support bundles of cables can impede or cause a blockage to port accessibility (e.g., for module replacements and/or connection of a cable to a port). This is particularly a concern for rows of ports arranged along a port side of a device housing in which cables from different rows are all grouped together.

BRIEF DESCRIPTION OF THE DRAWINGS

FIG. 8C depicts a partial view in cross-section of the cable support and routing system of FIG. 8A.

DESCRIPTION OF EXAMPLE EMBODIMENTS

Overview

Figure 1:
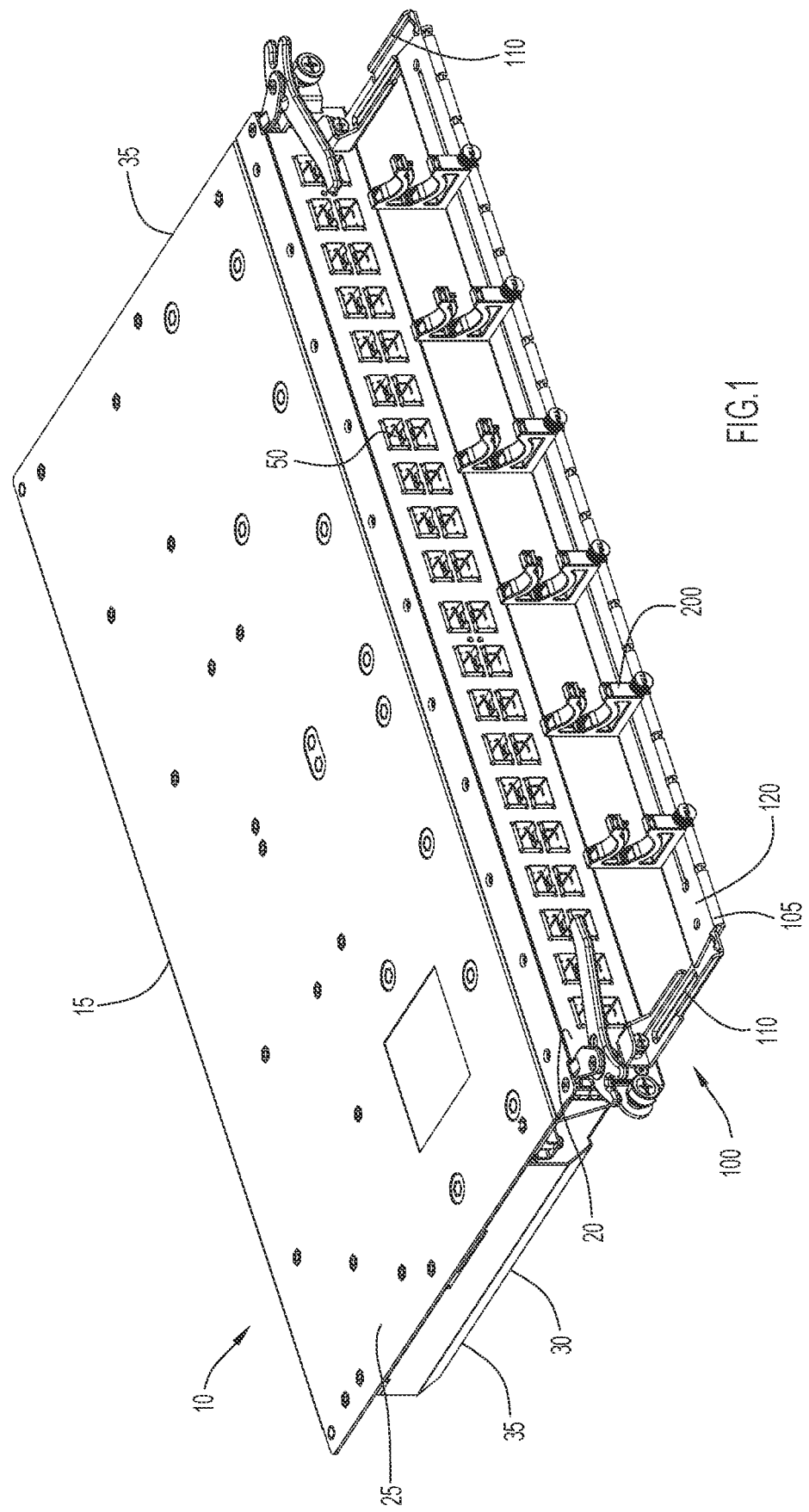
FIG. 1 depicts a front view in perspective of a networking device including a cable support and routing system to bundle groups of cables connected with the networking device in accordance with an example embodiment.
Figure 2:
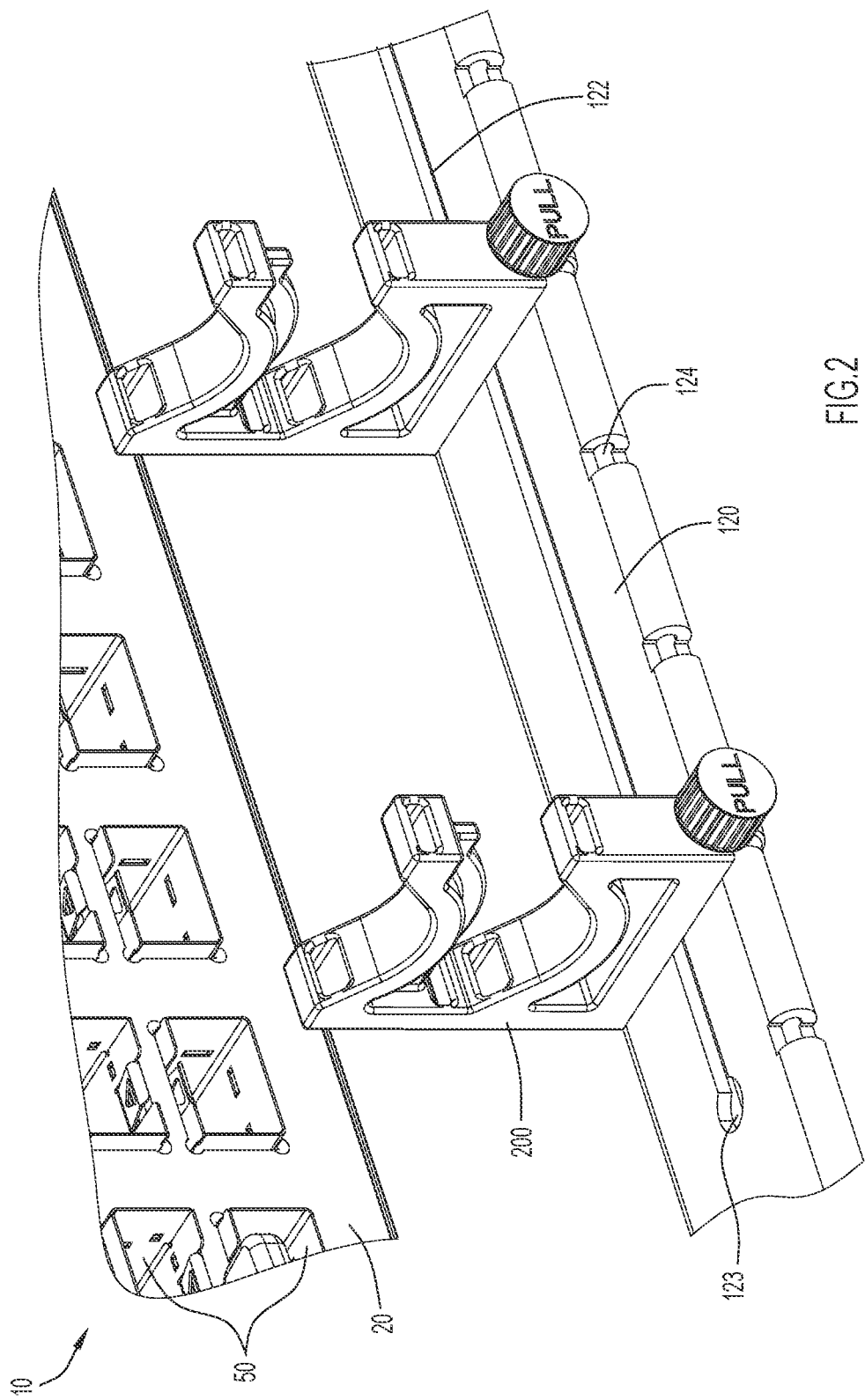
FIG. 2 depicts a partial enlarged view of the networking device with cable support and routing system of FIG. 1.

A system comprises a tray, where the tray includes a rail and a bracket that secures the rail to a networking device such that the rail is distanced from a surface of the networking device. A support post is removably coupled to the rail. The support post includes a first support member and a second support member vertically displaced from the first support member, where each of the first and second support members includes a support structure that supports a cable connected with a port at the surface of the networking device and routes the cable away from the networking device to another location distanced from the networking device. The cable supported by the first support member is separated and segregated from the cable supported by the second support member.

In addition, a networking device comprises a housing including electronic components, where a plurality of ports are provided along a port side of the housing, and a tray comprising a rail and a bracket that secures the rail to the port side of the networking device such that the rail is distanced from the port side of the networking device. A support post is removably coupled to the rail. The support post includes a first support member and a second support member vertically displaced from the first support member, where each of the first and second support members includes a support structure that supports a cable connected with one of the plurality of ports at the port side of the networking device and routes the cable away from the networking device to another location distanced from the networking device. The cable supported by the first support member is separated and segregated from the cable supported by the second support member.

Further, a method comprises securing a tray to a port side of a housing for a networking device, where the tray comprises a bracket that secures to the port side and a rail that secures to the bracket such that the rail is distanced from the port side. The method further comprises coupling a plurality of support posts to the rail, where each support post includes a first support member and a second support member vertically displaced from the first support member, wherein each of the first and second support members includes a support structure that supports a plurality of cables. A first group of cables connected with ports at the port side is supported with the first support member for each support post so as to route the first group of cables away from the networking device to a location distanced from the networking device and a second group of cables connected with ports at the port side is supported with the second support member for each support post so as to route the second group of cables away from the networking device to the location distanced from the networking device. The first group of cables supported by the first support member is separated and segregated from the second group of cables supported by the second support member.

Example Embodiments

A cable support and routing system is provided that couples a networking device to facilitate support and routing of bundles of cables connected at a port side (e.g., the front side) of the networking device. A networking device, as described herein, refers to any computing and/or other device that facilitates or supports networking communications between two or more computing devices distanced from each other. Some non-limiting examples of networking devices include hubs, routers, switches, digital line cards, data storage devices and/or other computing devices, etc. that receive and transfer data over any one or more types of networks and/or combinations of networks (e.g., local area networks, wide area networks, virtual private networks, etc.). The devices can be located in data centers (e.g., which require transfer of data signals and/or electrical power between multiple devices) and/or at any other locations which require the routing of numerous bundles of cables from one or more devices to other connection locations. The networking devices can transfer and receive data over any suitable types of Ethernet and/or other types of data transmission/network cables, such as optical cables (e.g., utilizing fiber optics) and/or electrical cables (e.g., utilizing copper or other conductive wiring). A typical networking device can include a plurality of cable ports at a port side of the device, where the port side is typically a front side of the device. Each cable port is suitably dimensioned and configured to receive a corresponding network cable via a female to male mating connection. The cable support and routing system as described herein facilitates mounting of a plurality of cables by the system and routing such cables in a bundle to another connection distanced from the networking device, where the system enables a secure connection while minimizing bending of the cables beyond a certain radius of curvature or bend radius along their route thus ensuring optimal transmission of data by the cables to and from the networking device.

Referring to FIGS. 1-4, an example embodiment is depicted of a cable support and routing system 100 that is coupled with a networking device 10 in a manner as described herein. The networking device 10 comprises a chassis or housing that includes a front panel or front side 20 (also referred to herein as a port side), a rear panel or rear side 15, a top panel or top side 25, a bottom panel or bottom side 30, and side panels or sides 35 that connect between top, bottom, front and rear sides to define an enclosure therebetween that houses computing and/or other electronic components (e.g., a printed circuit board including memory, one or more processors and/or other components formed thereon or integrated therewith, cooling fans, etc.) of the networking device. The housing can be constructed of a metal and/or other suitably rigid material that effectively protects the electronic components secured within the housing. At the port side or front side 20 of the housing is provided a plurality of ports 50 (e.g., network cable ports). The ports can be configured to provide any suitable one or more types of connection between the device and corresponding cables or other signal carriers that mate with the ports including, without limitation, Ethernet cable ports, optical cable ports, USB ports, and ports for providing an electrical power connection between the device 10 and any other device and/or power source. The ports are typically arranged in one or more rows at the front housing side of a networking device (e.g., two rows of ports 50 for the networking device 10 depicted in the figures, with one row aligned vertically over the other) so as to provide a high density arrangement of ports efficiently along the port side surface of the device. The ports 50 are further configured of a certain type to facilitate a connection with a corresponding cable in a male-to-female mating connection. Further, the ports 50 can be of the same type or different types. For example, the front side of the device housing can include ports of different types arranged in groups (e.g., in separate rows, columns or other combinations).

The cable support and routing system 100 includes a generally U-shaped tray 105 that includes a rail 120 that extends at least a portion (e.g., a substantial portion) of the length of the housing front side 20. The components of the system 100 can be constructed of any suitable materials (e.g., metals, molded and/or other types of plastic materials, etc.) having a sufficient rigidity and strength to support and route cables in the manner described herein. A transversely extending bracket 110 is secured at each lengthwise end of the rail 120 to form the general U-shape for the-. Each bracket 110 secures to a portion of the housing front side 20 (e.g., at or near a lengthwise end of the housing front side) via one or more threaded screws or any other suitable fastener. Accordingly, the rail 120 is secured at a distance from the surface of the front side 20 (where the distance is based upon the length of the brackets 110). The rail 120 includes an elongated cut-out section extending a lengthwise dimension of the rail that defines a groove or track 122 along which a post can be coupled so as to facilitate sliding movement of the post along the rail via the track as further described herein. The rail 120 further includes a plurality of spaced apart notches 124 located along a lengthwise extending outer edge of the rail. As further described herein, the notches 124 provide locking or stop points for a post coupled with the rail.

Figure 3:
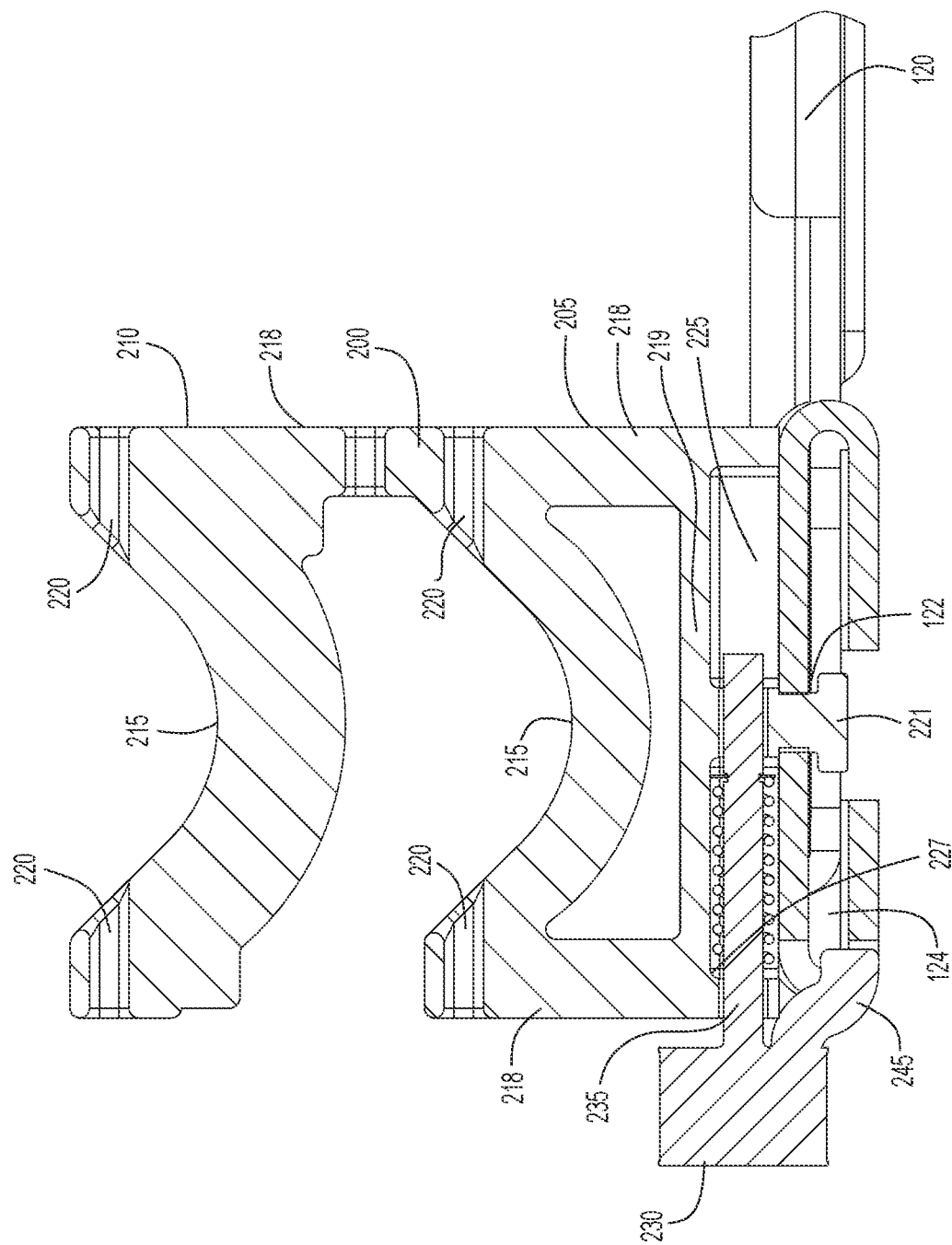
FIG. 3 depicts a partial view in cross-section of the cable support and routing system of FIG. 1.
Figure 4:
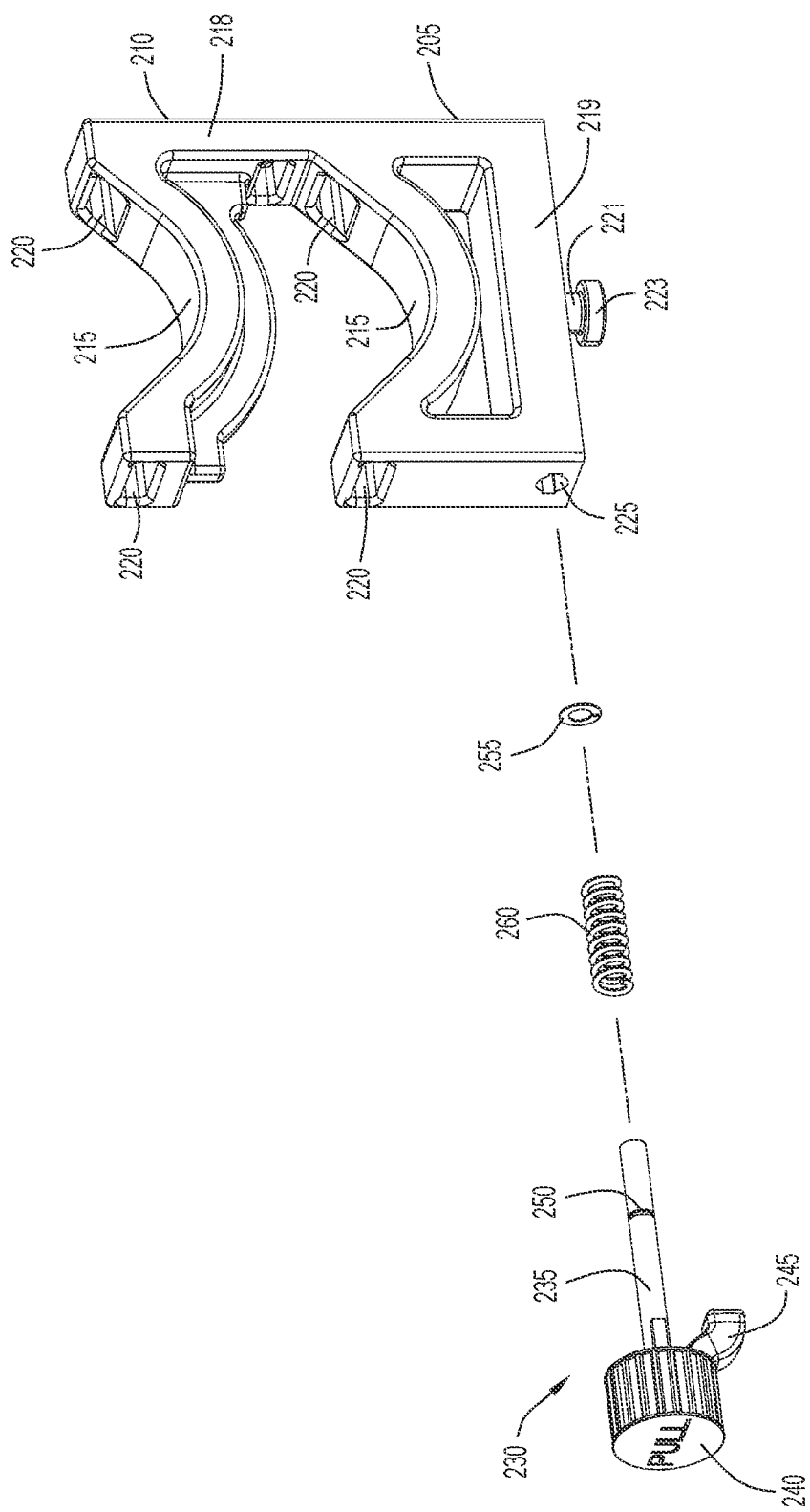
FIG. 4 depicts an exploded view of an example embodiment of a cable bundle support post for the cable support and routing system of FIG. 1.

The system further includes one or more cable bundle support posts that removably couple with the rail, where the position of each post can further be adjusted along the rail and, in some embodiments without removing the post from the rail (e.g., via a sliding movement of the post along a portion of the rail). Referring to FIGS. 3 and 4, a post 200 includes a lower or first support member 205 and an upper or second support member 210 connected with and supported by the first support member 205 (i.e., the second support member 210 is vertically aligned with the first support member 205). Each support member 205, 210 includes a support structure that supports a bundle of cables and facilitates routing of such cables to a location distanced from the device 10 while minimizing bending of the cables along their routes. In particular, each support member 205, 210 includes a generally U-shaped or concave arm or concave member 215 that is supported by at least one leg 218, where the concave member 215 of the second support member 210 is separated a distance from the concave member 215 of the first support member 205. In particular, the first support member 205 includes two legs 218 at each end of the concave member 215, while the second support member 210 supports the concave member 215 with a single leg located at one end of the concave member 215 (so that the concave member 215 of the second support member 210 is cantilevered from its leg 218).

Each of the legs 218 of the first support member 205 are further connected at their lower ends with an upper surface of an elongated base or beam 219. A projection 221 extends from a lower surface of the beam 219 (e.g., at around a central lengthwise location) and is suitably dimensioned to be received within the groove or track 122 of the rail 120. The projection 221 can further include a head 223 at its free end, where the head 223 has a larger dimension than the projection 221 to prevent removal of the post 200 from the rail when the projection is engaged with the rail track. The track 122 can include one or more locations (e.g., at one or both ends of the track, such as location 123 as shown in FIG.

2) having a larger dimension to accommodate insertion and removal of both the projection 221 and its head 223 through the track 122 to selectively couple and decouple the post 200 from the rail 120.

The beam 219 includes a linear bore 225 extending through a portion of the beam and emerging at its front surface (i.e., a surface that faces away from the rail 120 when the post 200 is coupled with the rail). The bore 225 is suitably dimensioned to permit entrance and retention of a portion of a locking pin 230 within the bore when the locking pin is inserted through the bore opening at the front surface of the beam 219. The locking pin 230 includes an elongated shaft 235 and a finger gripping head 240 disposed at one end of the shaft. The shaft 235 is suitably dimensioned for partial or complete insertion within the bore 225 (as shown, e.g., in FIG. 3), whereas the head 240 is larger in size such that it cannot enter the bore. The shaft 235 includes an annular cut-out portion or indentation 250 that is dimensioned to receive and retain a partial annular locking member or C-Clip 255. A coil spring 260 or other suitable resilient member is also provided within an enlarged cavity within the bore 225. When the locking pin 230 is installed within the bore 225, at least a portion of the shaft 235 including indentation 250, C-Clip 255 and spring 260 reside within the enlarged bore cavity with the spring 260 being located between the C-Clip 255 and the head 240. The bore opening further has a reduced or smaller dimension than the transverse dimension(s) of the enlarged cavity within the bore 225, where an interior annular ledge or abutment 227 is provided at the transition from the enlarged cavity to the bore opening to prevent escape of the spring 260 from the bore. In this configuration, the spring 260 surrounds a portion of the shaft 235 and engages with the abutment 227 within the bore 225 and the C-Clip 255 of the shaft 235 so as to bias the a portion of the locking pin 230 between the head 240 and the indentation 250 (where the C-Clip is engaged) within the bore.

The locking pin 230 further includes a curved locking member 245 that extends from the finger gripping head 240 and/or the shaft 235 (at a location near the gripping head) below and in a direction corresponding with the linear dimension of the shaft 235. The locking member 245 is suitably dimensioned to fit within each notch 124 disposed along the front edge of the rail 120.

During operation, a post 200 can be coupled with the rail 120 by inserting the projection 221 at the lower end of the beam 219 (serving as a post base) into the track 122 (e.g., by insertion of the projection 221 and head 223 into the enlarged portion at the location 123 of the track 122) and moving or sliding the post along the track 122 to a desired position. The post 200 can further be locked in place along the track 122 by engaging the locking member 245 within a notch 124 of the rail 120. This can be achieved by pulling the finger gripping head 240 outward and away from the rail 120, which causes a compression of the spring 260 within the bore 225 (i.e., at a location of the shaft 235 between the C-Clip 255 and the abutment 227 within the bore). The post 200 can be positioned along the rail 120 so that the locking member 245 is aligned with the notch 124. When the head 240 is released, the bias of the spring 260 forces the head 240 back toward the rail 120 so as to engage the locking member 245 with the notch 124 to lock the post 200 in a fixed position. Release of the post 200 from this position is easily achieved by pulling the head 240 away from the rail 120 so as to disengage locking member 245 from the notch 124.

As shown in the figures, a plurality of posts 200 can be coupled with the rail 120 and moved by sliding the posts along the rail to desired positions at selected distances from each other to facilitate support and routing of cables from the ports 50 of the device 10.

Figure 5:
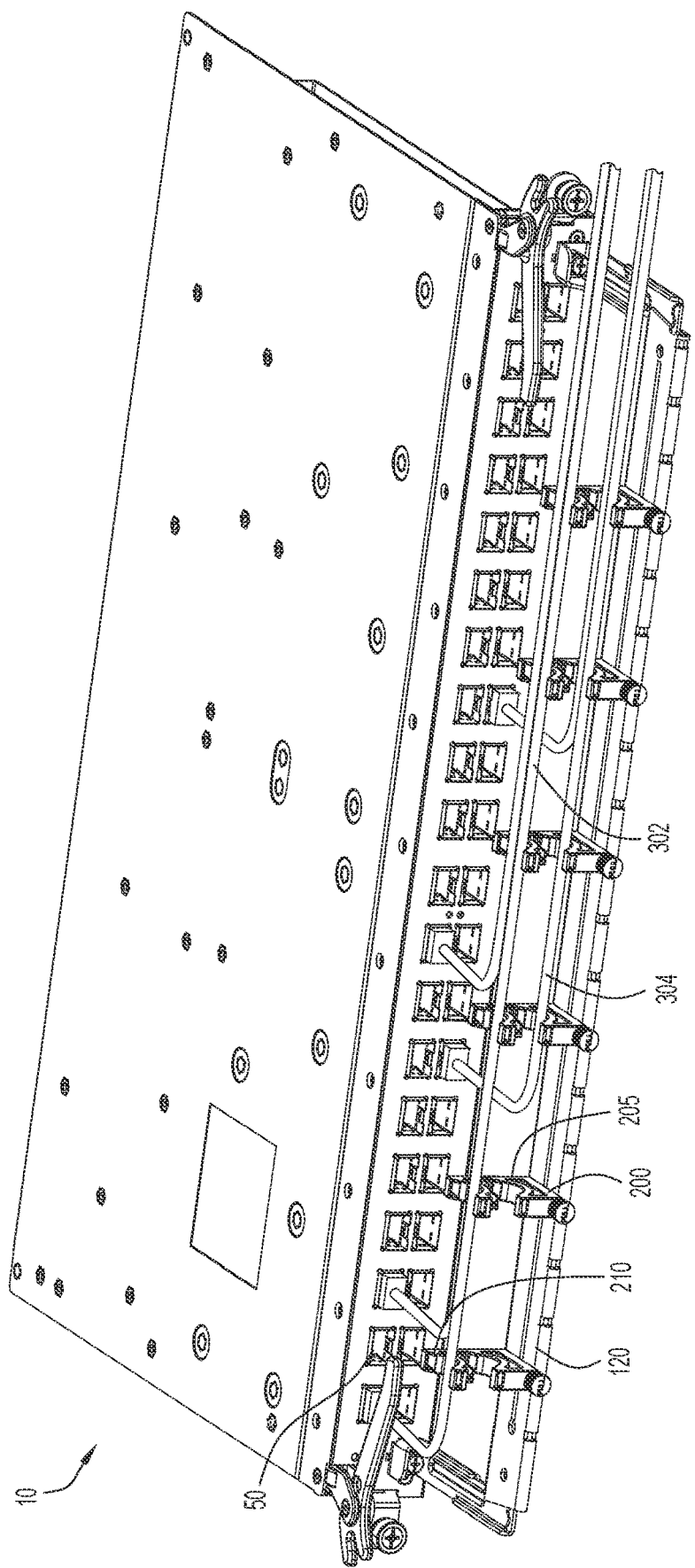
FIG. 5 depicts a front view in perspective of the networking device with cable support and routing system of FIG. 1 including bundles of cables supported and routed by the system.

Each post 200 can support and route a plurality of cables connected with ports 50 at the port side or front side 20 of the device 10 utilizing either or both of the concave members 215 of the first support member 205 and second support member 210. The cables are placed over so as to rest upon the concave members 215 for each support member. As shown, e.g., in FIG. 5, a plurality or second group of cables 302 connected with a second (e.g., upper) row of ports 50 can be bundled together and supported by the concave member 215 of the second (upper) support member 210 for each post 200 (where one or more cables engage the concave member 215). A sufficient number of posts 200 are provided to ensure adequate support of the second group of cables 302 and minimization of a drooping, bending or extreme radius of curvature forming along the trajectory of the cables as the cables are directed along and toward an edge of the housing front side 20 and away from the housing for connection with another device or connection structure. In addition, a plurality or first group of cables 304 connected with a first (e.g., lower) row of ports 50 can be bundled together and supported by the concave member 215 of the first (lower) support member 205 for each post 200 (where one or more cables engage the concave member 215). The pair of concave members 215 of each post 200 which are spaced apart from each other facilitates support and routing of two or more cables separated and segregated from each other. Thus, as shown in the example embodiment of FIG. 5, the second (upper) row of cables 302 are bundled together, supported and routed by the second (upper) support members 210 of the posts 200, while the first (lower) row of cables 304 are bundled together, supported and routed by the first (lower) support members 205 of the posts 200. The first and second groups of cables are thus separated and segregated from each other by the posts 200 as they are supported and routed from the device to another location. The first and second groups of cables can further be of the same type or of different types.

While not shown, the posts can further include straps and/or other additional securing structure, such as Velcro (i.e., hook and loop fastener) straps, that can be passed or threaded through openings 220 provided at the ends of each concave member 215 of the posts 200. The straps can be tightened around a bundle of cables resting upon a concave member 215 so as to cinch and hold the bundle of cables against the concave member 215.

The configuration of the posts 200 and rail 120 facilitates easy sliding movement of each post 200 to a desired location along the rail 120. This allows for placement of posts 200 to enhance access of ports 50 (e.g., for connection of cables to such ports) and/or access to other locations along the housing front side 20 so as to facilitate insertion/installation or removal of other components for the device 10 (e.g., line cards, internal fans, or other hardware components) at the housing front side 20. In fact, very little effort and minimal touch is required to unlock a post 200 (e.g., by pulling the finger gripping head 240 of the locking pin 230 outward and away from the rail 120) so as to move it by sliding the post along the rail to a different location. This can further be accomplished while having one or more cables supported within one or both concave members 215 of the posts 200. In this configuration, the bundles of cables are all supported and routed by posts 200 which are coupled with and located above the rail 120 of the system 100.

The cable support and routing system can be modified in a number of ways while still being configured to support bundles (i.e., a plurality of) cables as well as separate and segregate different bundles of cables connected with a networking device.

Figure 6B:
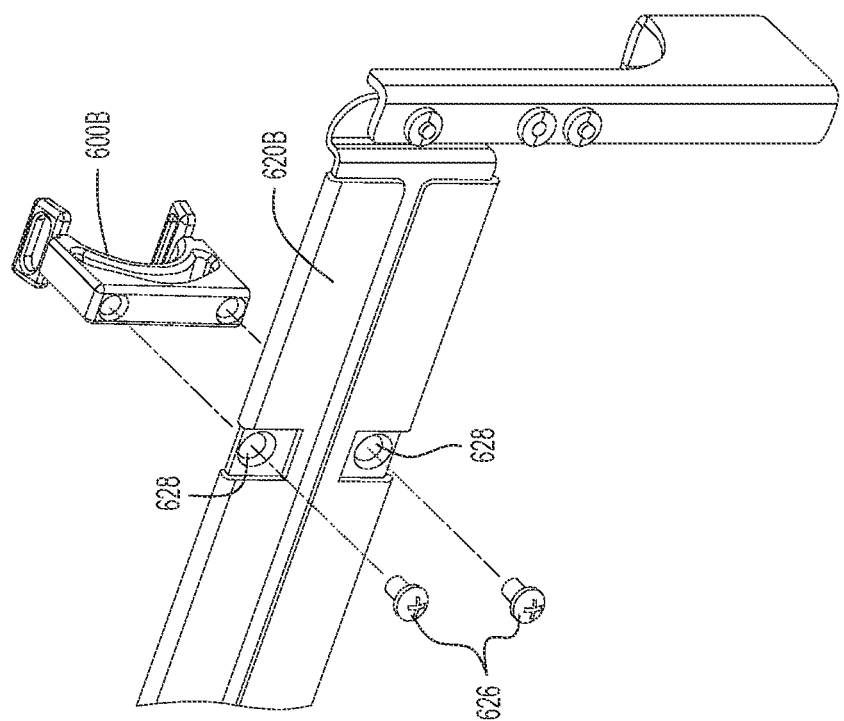
FIGS. 6A and 6B depict alternative embodiments of securing structure for supporting a cable bundle support post on a rail of a cable support and routing system.
Figure 6A:
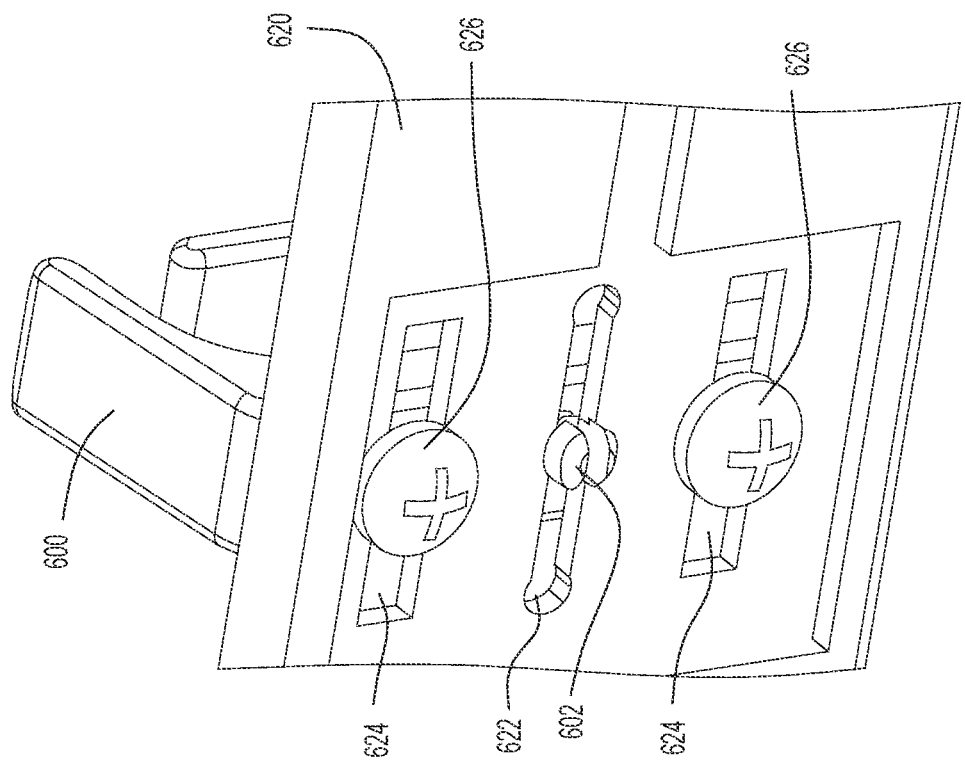

For example, referring to FIGS. 6A and 6B, the system can be revised in a manner in which a plurality of posts are connected to the rail of the system to support and route network cables from their port connections with a networking device to a location distanced from the device while minimizing bending of the cables along their routes. In the example embodiment of FIG. 6A, a post 600 is similar in configuration to the post 200 of FIGS. 1-5, with the exception that the post 600 does not include a bore or locking pin. The rail 620 is similar in configuration as the rail 120 of FIGS. 1-5 with the exception that rail 620 includes a central groove or slot 622 that is smaller in linear dimension than the slot or track 122 of the rail 120. The slot 622 is configured to receive and retain a guide post or protrusion 602 extending from a lower surface of the base for the post 600. Located alongside the slot 622 on the rail 620 is one or more further securing slots 624 (e.g., two securing slots 624 are provided, one slot 624 on each side of slot 622) which have a similar lengthwise dimension and extend in the same general direction as and are generally parallel with the slot 622. A threaded fastener 626 (e.g., a screw or bolt) extends through each slot 624 and secures with a corresponding threaded bore of the base for the post 600. This configuration allows the post 600 to have a limited sliding movement along the slot 622 of the rail 620, where the post 600 can further be fixed in place along the rail by tightening of the threaded fasteners to force the post base against the rail. The rail 620 can further include a plurality of slots 622 (and corresponding securing slots 624) provided at spaced locations along the rail to facilitate placement of one or more posts 600 at different locations along the rail.

In FIG. 6B, another embodiment is depicted for securing a post to the rail, where the rail 620B includes one or more bore holes 628 and the post 600B includes a corresponding one or more threaded bore holes along a lower surface of its base to facilitate fastening of the post to the rail via threaded fasteners 626 (i.e., the fasteners 626 are inserted through the bore holes 628 and into the threaded bore holes of the post 600B to connect the post to the rail). The rail 620B can include sets of bore holes 628 at a plurality of locations along a length of the rail 620B to facilitate fastening of one or more posts 600B at varying locations along the rail.

Figure 7A:
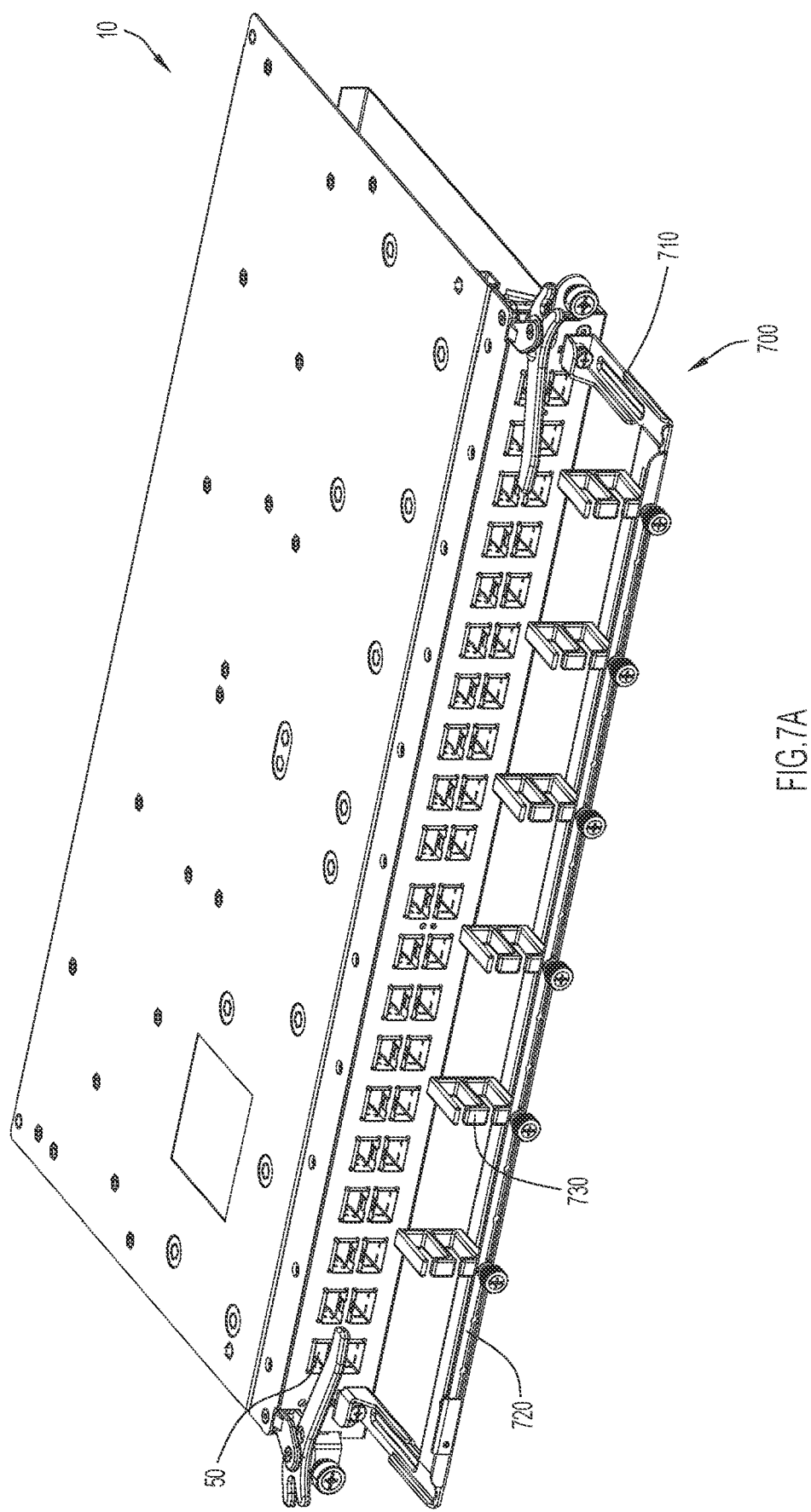
FIG. 7A depicts a front view in perspective of a networking device including a cable support and routing system to bundle groups of cables connected with the networking device in accordance with another example embodiment.
Figure 7B:
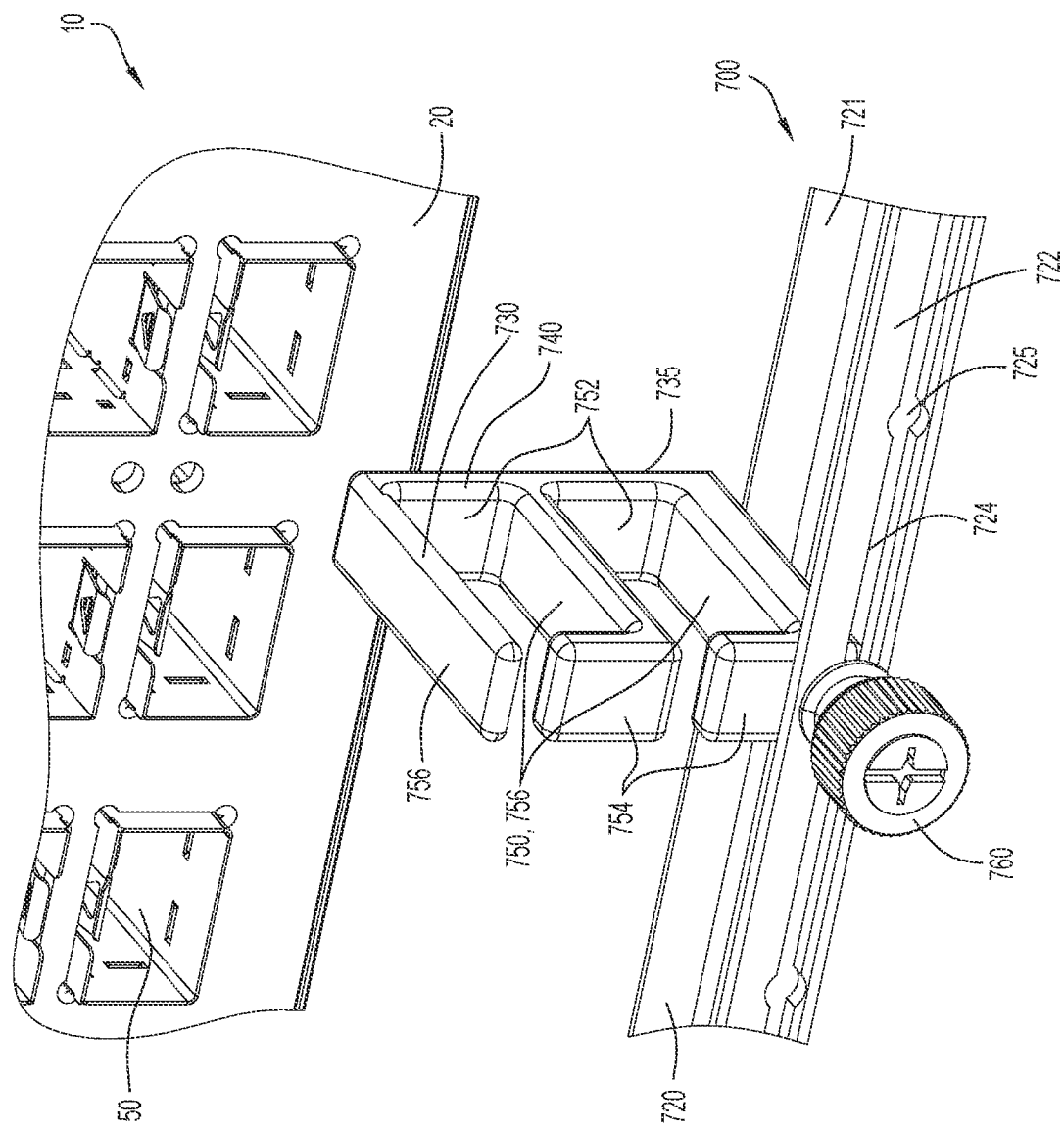
FIG. 7B depicts a partial enlarged view of the networking device with cable support and routing system of FIG. 7A.

In another embodiment depicted in FIGS. 7A and 7B, a cable support and routing system 700 is secured to a port side or front side 20 of a networking device 10 (where the device 10 includes a plurality of ports 50, such as network ports, provided in rows along the front side 20) in a manner similar to the system 100 depicted in FIGS. 1-5. In particular, the system 700 includes a generally U-shaped tray that includes a rail 720 secured to the housing front side 20 via a pair of brackets 710, where each bracket 710 is disposed at a lengthwise end of the rail 720. The rail 720 has a general L-shaped cross-section, including a base 721 and a mounting wall 722 that extends vertically from an outward edge of the base 721 (i.e., an edge of the base that faces away from the housing front side 20 when the tray is mounted to the housing) to define the L-shape for the rail. In this embodiment, an elongated cut-out section is provided in the mounting wall 722 that extends a lengthwise dimension of the mounting wall and defines a groove or track 724 that facilitates a coupling of a plurality of cable support posts 730 to the rail 720 and sliding movement of the posts along the rail via the track as described herein. The track 724 of the rail 720 can include one or more locations (such as location 725 as shown in FIG. 7B) having a larger dimension than other portions of the track to provide a locking location for a post as described herein.

Each post 730 of the system 700 also includes a lower or first support member 735 and an upper or second support member 740, where the second support member is secured to and located above the first support member and each member includes a support structure that supports a bundle of cables connected with ports 50 of the device 10 and facilitates routing of such cables to a desired location distanced from the device while ensuring a proper connection and minimizing bending (e.g., minimizing a bend radius) of the cables along their route thus ensuring optimal transmission of data by the cables to and from the networking device. In this embodiment, each support member 735, 740 has a generally rectangular shape formed by elongated legs that combine to form an open interior between the legs. In particular, each support member 735, 740 includes a lower or base leg 750 (where the base leg 750 extends transverse the lengthwise dimension of the rail when the post 730 is secured to the rail), a rear side leg 752 that connects with and extends upward from a lengthwise end of the base leg 750, a front side leg 754 that connects with and extends upward from the other lengthwise end of the base leg 750, and a top leg 756 that connects with the rear side leg 752 and extends toward but does not connect with the front side leg 754. In other words, the front side leg 754 for each support member 735, 740 has a shorter length than the rear side leg 752 such that a slight gap exists between the top leg 756 and front side leg 754. The top leg 756 of the lower or first support member 735 also defines the base leg 750 of the upper or second support member 740. In this configuration, when the support post 730 is coupled with the rail 720, each support member 735, 740 is dimensioned to receive and support a bundle of cables connected with ports 50 of the device 10, where the cables can be received between the legs 750, 752, 754, 756 of each support member 735, 740 by insertion at the gap between the front side leg 754 and the top leg 756 (where the gap provides an opening between the legs). In other words, the legs 750, 752, 754, 756 provide a partial enclosure, structural perimeter or frame surrounding an open space in which the cables are supported so as to maintain the bundle of cables within the support member when the cables are placed within such partial enclosure, frame or structural perimeter.

In the system 700, each post 730 secures to the mounting wall 722 of the rail 720 via the base leg 750 of its lower or first support member 735. A threaded bore can be provided at a front surface of the base leg 750 of the first support member 735 that is suitably dimensioned to receive a locking pin 760. The post 730 is coupled with the rail 720 with the base leg 750 of the first support member 735 engaging the base 721 of the rail and its base wall front surface facing the mounting wall 722. The locking pin 760 can be suitably dimensioned so as to be inserted through the track 724 of the mounting wall 722 and engaged (e.g., threaded engagement) with the bore of the base leg 750 for the first support member 735 so as to secure the post 730 with the rail 720. The post 730 can slide along the rail 720 via the locking pin 760 moving within the track 724. The post 730 can further be locked in position with the rail 720 at a location 725. For example, the pin 760 can include an enlarged portion that is larger in dimension than a dimension of the track but smaller in dimension than a dimension of the location 725. When the post 730 is moved along the rail 720 to position the pin 760 at the location 725, the pin 760 can be further inserted (e.g., by threaded engagement) into the bore of the first support member 735 such that the enlarged portion of the pin 760 extends at least partially into the track at location 725 (thus preventing further sliding movement of the post along the track).

As with the embodiment depicted in FIGS. 1-5, the system 700 of FIGS. 7A and 7B facilitates placement of posts 730 along the rail 720 at a number of different positions to maximize support and routing of bundles of cables secured to the ports 50, where a first bundle of cables (e.g., cables connected to an lower row of housing ports, where the first support members 735 of the posts 730 support and route the first bundle of cables) can be separated and segregated from a second bundle of cables (e.g., cables connected to an upper row of housing ports, where the second support members 740 of the posts 730 support and route the second bundle of cables).

Figure 8A:
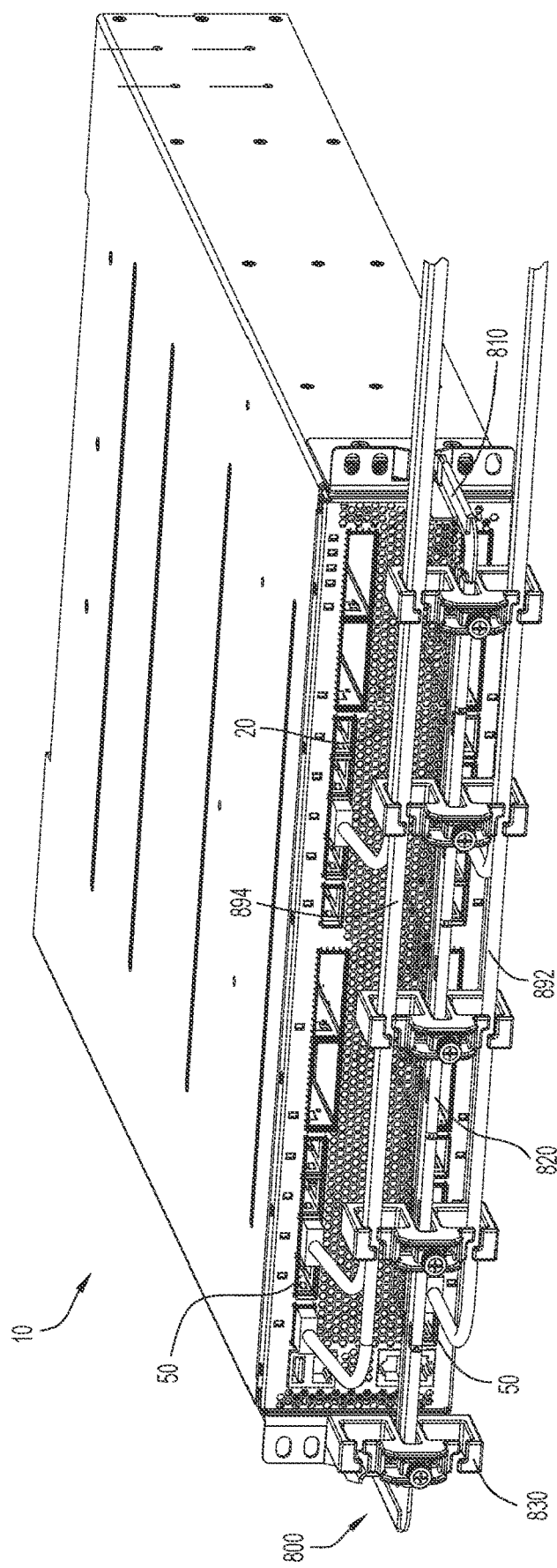
FIG. 8A depicts a front view in perspective of a networking device including a cable support and routing system to bundle groups of cables connected with the networking device in accordance with a further example embodiment.
Figure 8B:
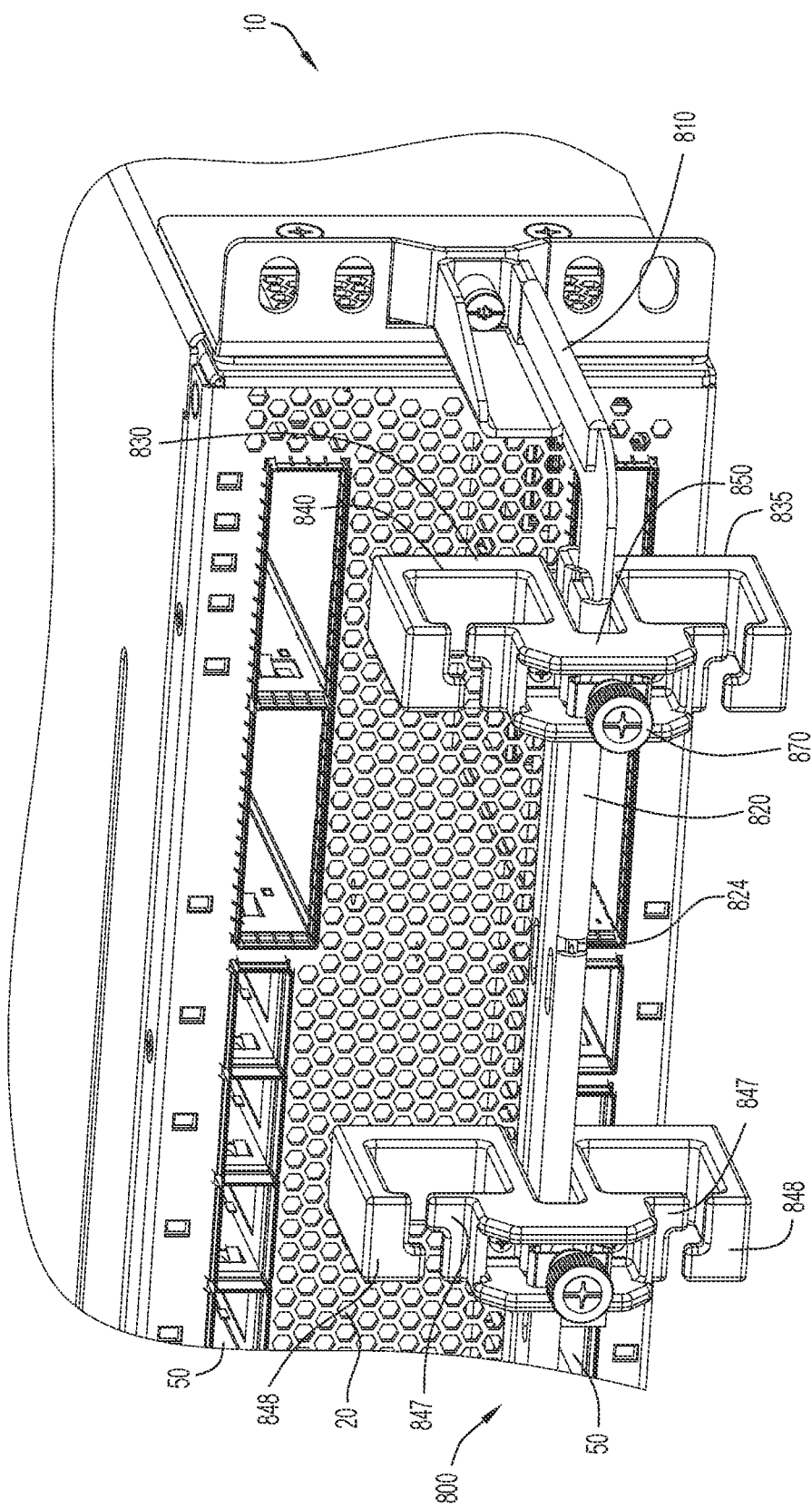
FIG. 8B depicts a partial enlarged view of the networking device with that cable support and routing system of FIG. 8A.

A further example embodiment is depicted in FIGS. 8A-8C, where a cable support and routing system 800 is secured to a port side or front side 20 of a networking device 10 (where the device 10 includes a plurality of ports 50, such as network ports, provided in rows along the front side 20) in a manner similar to the system 100 depicted in FIGS. 1-5. The system 800 includes a generally U-shaped tray that includes a rail 820 secured to the housing front side 20 via a pair of brackets 810, where each bracket 810 is disposed at a lengthwise end of the rail 820. The rail 820 includes one or more notches 824 (e.g., a plurality of notches) disposed at varying locations along a front side or edge of the rail. A plurality of cable bundle support posts 830 are coupled with the rail 820 and can move in a sliding manner along the rail to certain locked positions as described herein.

Each post 830 includes a lower or first support member 835 and an upper or second support member 840, where the support members 835, 840 are secured to a central member 850 that couples the post to the rail 820 in a manner in which the first support member 835 is located below the rail and the second support member 840 is located above the rail. In addition, and as can be seen in FIGS. 8A-8C, each post 830 is generally symmetrical about an axis that is perpendicular the lengthwise dimension of the post such that the first and second support members can be interchanged (i.e., the post can be rotated 180° about its symmetrical axis and utilized in the same manner as described herein). Each support member 835, 840 has a generally rectangular shape formed by elongated legs that combine to form an open interior between the legs. In particular, each support member 835, 840 includes a base leg 842 that connects with a rear side of the central member 850, where each base leg 842 extends in a direction transverse the lengthwise dimension of the rail 820 (i.e., in a direction of the width of the rail). The base leg 842 of the first support member 835 is further separated from the base leg 842 of the second support member 840 a distance that defines a gap, where the gap is slightly larger than a thickness dimension of the rail 820. This permits the post 830 to be coupled with the rail 820 by insertion of the rail within the gap with the rear side of the central member 850 facing the rail such that the base leg 842 of each support member 835, 840 engages with an upper surface or lower surface of the rail (with first support member 835 being positioned below the rail and second support member 840 being positioned above the rail).

A rear side leg 844 connects with and extends transversely from each base leg 842 for each support member so as to form a portion of the rear side of the post 830 (i.e., a side that faces the port side or housing front side 20 of the device 10 when the post is coupled with the rail). A further side leg 846 is connected with and extends transversely from each rear side leg 844 in a direction away from the rear side of the post 830. The free end of each side leg 846 includes a short leg or short stub 847 that extends transversely away from the leg end and toward the central member 850. The central member 850 also includes a pair of short legs or short stubs 848 that extend toward the stubs 847. A gap exists between the free ends of each stub 847 and corresponding stub 848, and this gap permits entry of a cable into the open center of each support member 835, 840, where the open center for each support member is suitably dimensioned to receive a plurality or bundle of cables. In other words, the base leg 842, rear side leg 844, side leg 846 and stubs 847, 848 of each support member provide a partial enclosure, structural perimeter or frame surrounding an open space in which the cables are supported so as to maintain the bundle of cables within the support member when the cables are placed within such structural perimeter. Further, the free ends of each stub 847, 848 can be nonplanar (e.g., a cut-out or stepped configuration along the edge of each free end of stubs 847, 848, as shown in FIG. 8B) so as to define an opening to the partial enclosure, structural perimeter or frame that is non-linear, angled or irregular shaped. Such an opening can enhance retention of a bundle of cables (e.g., minimizing or preventing undesired escape of one or more cables from the interior of a support member without user guidance through the opening).

The support members 835, 840 have a dimension D that corresponds with the lengthwise dimension of legs 842, 846 (as shown in FIG. 8C) and that is slightly greater than the width dimension of the rail 820 such that, when the post 830 is slid over the rail with support member 835 positioned below the rail 820 and support member 840 positioned above the rail 820, a rear side of the post 830 (which is defined by the rear side legs 844 of the support members 835, 840) extends slightly beyond a rear edge of the rail 820. A rear cover plate 890 is provided that secures to the rear side of the post 830 at each rear side leg 844 of the support members 835, 840, and this cover plate 890 effectively secures the post 830 against rail 820 for sliding movement of the post along the rail.

The central member 850 includes a hollow center or cavity including a resilient member 880 (e.g., a leaf spring) disposed within the cavity. A locking pin 870 extends through a bore or channel that is defined through the central member 850 and is in communication with the cavity. The locking pin 870 includes a finger gripping head 872 disposed outside of the bore and cavity of the central member 850 at a front side of the post 830. The finger gripping head 872 is dimensioned so that it cannot enter into the bore at the post front side. A shaft or plunger 874 is connected with the head 872 and extends through the bore and cavity and further partially into the gap defined between the base legs 842 of the support members 835, 840. The plunger 874 includes a locking head 876 connected at its free end that is disposed within the gap between the support members 835, 840. The locking head 876 is dimensioned so as to fit within the one or more notches 824 disposed along the front side or edge of the rail 820.

Within the cavity of the central member 850, the resilient member 880 is coupled with the plunger 874 so as to bias the plunger in a direction F as shown in FIG. 8C, which is a direction toward the rail 820 when the post 830 is coupled with the rail 820. When the post 830 is coupled with the rail 820 (as shown in FIGS. 8A and 8B), the locking head 876 engages a front side of the rail 820 due to the bias of the resilient member 880. The post 830 can still freely move in a sliding manner along the rail (i.e., in a lengthwise dimension of the rail) with the plunger 874 being biased in this manner. However, when the post 830 is positioned along the rail 820 such that the locking head 876 is aligned with a notch 824 at the front side or edge of the rail 820, the bias of the resilient member 880 pushed the plunger 874 further in the direction F toward the rail so as to lock the locking head 876 within the notch 824. This effectively locks the post 830 in a fixed position on the rail. This locking or fixed position can be overcome by pulling the locking pin 870 (by gripping the head 872) in a direction away from the central member 850 (i.e., in a direction opposing direction F) and against the bias of the resilient member 880 so as to release the locking head 876 from the notch 824 and sliding the post 830 to another position along the rail 820. After moving the post 830 to a position in which the locking head 876 is no longer aligned with the notch 824, the finger gripping head 872 can be released causing movement of the plunger 874 back in the direction F (due to the bias of the resilient member 880) so as to push the locking head 876 back against the rail 820. The post 830 can then be moved in a sliding manner to another position along the rail 820 until the locking head 876 reaches and aligns with another notch 824.

As previously noted, when the post 830 is coupled with the rail 820, a first support member 835 is positioned below the rail while a second support member 840 is positioned above the rail. This system configuration is provided for embodiments in which rows of ports 50 on a device 10 are separated a certain distance from each other. As depicted in FIG. 8A, the system configuration permits a bundle of cables 892 connected with a first row of ports 50 (e.g., network ports) to be supported and routed by the lower or first support members 835 of the posts 830 positioned below the rail 820, while another bundle of cables 894 connected with a second row of ports 50 (e.g., network ports) located a certain distance above the first row of ports 50 can be supported and routed by the upper or second support members 840 of the posts 830 positioned above the rail 820.

While a number of different system embodiments have been described and depicted in the figures, with modifications to the posts and rails being described for different embodiments, it is noted that the systems described herein can be easily modified such that posts of one embodiment may be utilized with a rail of another embodiment.

Thus, the system embodiments described herein provide effective support and routing of a plurality of network cables connected with ports of a networking device while also enabling separation and segregation of certain groups of cables into different groups due to the plurality of support members provided on posts that are coupled with the rail. The system further enables such support and routing of cables while minimizing or preventing undesirable looping or bending of the cables beyond an undesired bend radius so as to ensure effective connection of the cables with the device and effective transfer of data signals via the cables during operation of the device. The system also provides easy movement of the posts to different locations along the rail and, in certain embodiments, easy sliding movement of the posts along the rail with minimal touching required to effect such movement. The ability to easily move the posts along the rail to varying positions allows the user to place the posts in the most suitable positions to effectively support and route a plurality or bundle of cables connected with a networking device while also ensuring adequate access to the front or port side of the device housing for connection of cables to ports as well as insertion/installation and/or removal of other components for the device (e.g., fans, interface cards, modules, etc.) via the housing front or port side.

Thus, an example embodiment of a system comprises a tray comprising a rail and a bracket that secures the rail to a networking device such that the rail is distanced from a surface of the networking device, and a support post removably coupled to the rail. The support post includes a first support member and a second support member vertically displaced from the first support member, where each of the first and second support members includes a support structure that supports a cable connected with a port at the surface of the networking device and routes the cable away from the networking device to another location distanced from the networking device. The cable supported by the first support member is separated and segregated from the cable supported by the second support member.

The system can further comprise a plurality of support posts removably coupled at different positions along the rail.

The support structure for each support member can be dimensioned to support a plurality of cables.

Each support member can comprise a concave member supported by a leg, wherein the concave member engages with the plurality of cables. In addition, each support member can further comprise a strap that secures the plurality of cables against the concave member. The first support member can comprise a pair of legs located at opposing ends of the concave member of the first support member, and the second support member can comprise a single leg located at one end of the concave member of the second support member such that the concave member of the second support member is cantilevered from the single leg.

Each support member can include a plurality of legs that connect to form a structural perimeter around an open space in which cables are provided for support by the support member. The structural perimeter formed by the plurality of legs for each support member can include a gap between two legs that provides an opening for cables to be received within the structural perimeter.

The first support member can be located below the rail and the second support member can be located above the rail when the post is coupled with the rail.

The support post can be coupled with the rail to permit a sliding movement of the support post along the rail. In addition, the rail can include a notch that facilitates locking of the support post in a fixed position with the rail when a protrusion provided on the support post engages with the notch.

In other embodiments, a networking device can be provided comprising a housing including electronic components, where a plurality of ports are provided along a port side of the housing, and a tray comprising a rail and a bracket that secures the rail to the port side of the networking device such that the rail is distanced from the port side of the networking device. At least one support post can be removably coupled to the rail, where each support post includes a first support member and a second support member vertically displaced from the first support member, and where each of the first and second support members includes a support structure that supports a cable connected with one of the plurality of ports at the port side of the networking device and routes the cable away from the networking device to another location distanced from the networking device. The cable supported by the first support member can be separated and segregated from the cable supported by the second support member.

The networking device can further comprise a plurality of support posts removably coupled at different positions along the rail. In addition, the plurality of ports can comprise a first row of ports and a second row of ports located above the first row of ports on the port side of the networking device. Cables secured to ports of the first row can be supported by the first support member of each support post, and cables secured to the ports of the second row can be supported by the second support member of each support post.

In further embodiments, a method comprises securing a tray to a port side of a housing for a networking device, where the tray comprises a bracket that secures to the port side and a rail that secures to the bracket such that the rail is distanced from the port side. A plurality of support posts can be coupled to the rail, where each support post includes a first support member and a second support member vertically displaced from the first support member, and further where each of the first and second support members includes a support structure that supports a plurality of cables. A first group of cables connected with ports at the port side can be supported with the first support member for each support post so as to route the first group of cables away from the networking device to a location distanced from the networking device. A second group of cables connected with ports at the port side can be supported with the second support member for each support post so as to route the second group of cables away from the networking device to the location distanced from the networking device, where the first group of cables supported by the first support member can be separated and segregated from the second group of cables supported by the second support member.

The cables of the first group can be secured to ports positioned in a first row along the port side, and the cables of the second group can be secured to ports positioned in a second row along the port side that is vertically displaced from the first row.

The first support member of each support post can be positioned below the rail and the second support member of each support post can be positioned above the rail when each support post is coupled with the rail.

The method can further comprise sliding at least one support post along the rail from a first position to a second position. In addition, the method can further comprise locking the at least one support post in a fixed position with the rail when the at least one support post is moved such that a protrusion provided on the at least one support post engages with a notch provided in the rail.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
    a tray comprising a rail and a bracket that secures the rail to a networking device such that the rail is distanced from a surface of the networking device; and
    a support post removably coupled to the rail, the support post including a first support member and a second support member vertically displaced from the first support member, wherein each of the first and second support members includes a support structure that supports a cable connected with a port at the surface of the networking device and routes the cable away from the networking device to another location distanced from the networking device;
    wherein:
    the cable supported by the first support member is separated and segregated from the cable supported by the second support member; and
    the support post is coupled with the rail to permit a sliding movement of the support post along the rail to a plurality of fixed positions spaced along a length of the rail, wherein each fixed position locks the support post in relation to the rail when a protrusion provided on the support post engages with a locking structure at each fixed position, the protrusion provided on the support post is biased in a first direction toward the rail so as to engage with the locking structure at each fixed position when the support post slidably moves along the rail, and the protrusion includes a gripping head that facilitates disengagement of the protrusion from the locking structure at each fixed position by moving the protrusion in a second direction away from the rail so as to unlock the support post from each fixed position to permit further sliding movement of the support post along the rail.

2. The system of claim 1, wherein the support post comprises a plurality of support posts removably coupled at different positions along the rail.

3. The system of claim 1, wherein the support structure for each support member is dimensioned to support a plurality of cables.

4. The system of claim 3, wherein each support member comprises a concave member supported by a leg, wherein the concave member engages with the plurality of cables.

5. The system of claim 4, wherein each support member further comprises a strap that secures the plurality of cables against the concave member.

6. The system of claim 5, wherein the first support member comprises a pair of legs located at opposing ends of the concave member of the first support member, and the second support member comprises a single leg located at one end of the concave member of the second support member such that the concave member of the second support member is cantilevered from the single leg.

7. The system of claim 3, wherein each support member includes a plurality of legs that connect to form a structural perimeter around an open space in which the plurality of cables are provided for support by the support member.

8. The system of claim 7, wherein the structural perimeter formed by the plurality of legs for each support member includes a gap between two legs that provide an opening for the plurality of cables to be received within the structural perimeter.

9. The system of claim 1, wherein the first support member is located below the rail and the second support member is located above the rail when the support post is coupled with the rail.

10. The system of claim 1, wherein the locking structure at each fixed position comprises a notch in the rail that facilitates locking of the support post at each fixed position with the rail when the protrusion provided on the support post engages with the notch.

11. A networking device comprising:
a housing including electronic components, wherein a plurality of ports are provided along a port side of the housing;
a tray comprising a rail and a bracket that secures the rail to the port side of the networking device such that the rail is distanced from the port side of the networking device; and
at least one support post removably coupled to the rail, each of the at least one support post including a first support member and a second support member vertically displaced from the first support member, wherein each of the first and second support members includes a support structure that supports a cable connected with one of the plurality of ports at the port side of the networking device and routes the cable away from the networking device to another location distanced from the networking device;
wherein:
the cable supported by the first support member of each of the at least one support post is separated and segregated from the cable supported by the second support member of each of the at least one support post and
each of the at least one support post is coupled with the rail to permit a sliding movement of each of the at least one support post along the rail to a plurality of fixed positions spaced along a length of the rail, wherein each fixed position locks each of the at least one support post in relation to the rail when a protrusion provided on each of the at least one support post engages with a locking structure at each fixed position, the protrusion provided on each of the at least one support post is biased in a first direction toward the rail so as to engage with the locking structure at each fixed position when each of the at least one support post slidably moves along the rail, and the protrusion includes a gripping head that facilitates disengagement of the protrusion from the locking structure at each fixed position by moving the protrusion in a second direction away from the rail so as to unlock each of the at least one support post from each fixed position to permit further sliding movement of each support post along the rail.

12. The networking device of claim 11, the cable comprises a plurality of cables removably coupled at different positions along the rail.

13. The networking device of claim 12, wherein the plurality of ports comprises a first row of ports and a second row of ports located above the first row of ports on the port side of the networking device.

14. The networking device of claim 13, wherein the cable comprises a plurality of cables secured to ports of the first row are supported by the first support member of each of the at lest one support post, and the cable comprises a plurality of cables secured to the ports of the second row are supported by the second support member of each of the at least one support post.

15. The networking device of claim 11, wherein the locking structure at each fixed position comprises a notch in the rail that facilitates locking of the support post of the at least one support post at each fixed position with the rail when the protrusion provided on the support post of the at least one support post engages with the notch.

16. A method comprising:
securing a tray to a port side of a housing for a networking device, wherein the tray comprises a bracket that secures to the port side and a rail that secures to the bracket such that the rail is distanced from the port side;
coupling a plurality of support posts to the rail, wherein each support post includes a first support member and a second support member vertically displaced from the first support member, wherein each of the first and second support members includes a support structure that supports a plurality of cables;
supporting a first group of cables of the plurality of cables connected with ports at the port side with the first support member for each of the at least one support post so as to route the first group of cables away from the networking device to a location distanced from the networking device;
supporting a second group of cables of the plurality of cables connected with ports at the port side with the second support member for each support post so as to route the second group of cables away from the networking device to the location distanced from the networking device;
sliding at least one support post of the plurality of support posts along a length of the rail, wherein the rail includes a plurality of fixed positions spaced along the length of the rail, and each fixed position includes a locking structure;
locking the at least one support post of the plurality of support posts at one of the fixed positions with the rail when the at least one support post is moved such that a protrusion provided on the at least one support post of the plurality of support posts engages with the locking structure of a corresponding fixed position along the rail, wherein the protrusion provided on the at least one support post of the plurality of support posts is biased in a first direction toward the rail so as to engage within the locking structure of the corresponding fixed position when the at least one support post of the plurality of support posts slidably moves along the rail to align the protrusion with the locking structure of the corresponding fixed position; and
unlocking the at least one support post of the plurality of support posts at the corresponding fixed position with the rail to permit further sliding movement of the at least one support post of the plurality of support posts along the rail and beyond the corresponding fixed position, wherein the unlocking includes moving the protrusion in a second direction away from the rail so as to disengage the protrusion from the locking structure of the corresponding fixed position;
wherein the first group of cables supported by the first support member is separated and segregated from the second group of cables supported by the second support member.

17. The method of claim 16, wherein the cables of the first group are secured to ports positioned in a first row along the port side, and the cables of the second group are secured to ports positioned in a second row along the port side that is vertically displaced from the first row.

18. The method of claim 16, wherein the first support member of each support posts of the plurality of support posts is positioned below the rail and the second support member of each support posts of the plurality of support posts is positioned above the rail when each support posts of the plurality of support posts is coupled with the rail.

19. The method of claim 16, wherein the locking structure at each fixed position comprises a notch in the rail that facilitates locking of each support posts of the plurality of support posts at each fixed position with the rail when the protrusion provided on each support post of the at least one support post engages with the notch.

* * * * *

UNITED STATES PATENT AND TRADEMARK OFFICE
CERTIFICATE OF CORRECTION

| | |
|---|---|
| PATENT NO. | : 11,184,688 B2 |
| APPLICATION NO. | : 16/672942 |
| DATED | : November 23, 2021 |
| INVENTOR(S) | : Rohit Dev Gupta et al. |

It is certified that error appears in the above-identified patent and that said Letters Patent is hereby corrected as shown below:

In the Claims

Claim 8, Column 14, Line 56, please replace "legs that provide" with --legs that provides--

Claim 14, Column 15, Line 53, please replace "at lest one" with --at least one--

Signed and Sealed this
First Day of November, 2022

Katherine Kelly Vidal
*Director of the United States Patent and Trademark Office*